(12) United States Patent
Huang et al.

(10) Patent No.: US 8,314,723 B2
(45) Date of Patent: Nov. 20, 2012

(54) GHOST KEY DETECTING CIRCUIT AND RELATED METHOD

(75) Inventors: Chiung-Chih Huang, Taipei (TW); Wen-Tong Liu, Taipei (TW); Kuo-Fu Kuo, Taipei County (TW)

(73) Assignees: Silitek Electronic (Guangzhou) Co., Ltd., Guangzhou (CN); Lite-On Technology Corporation, Taipei (TW)

( * ) Notice: Subject to any disclaimer, the term of this patent is extended or adjusted under 35 U.S.C. 154(b) by 668 days.

(21) Appl. No.: 12/511,997

(22) Filed: Jul. 29, 2009

(65) Prior Publication Data

US 2010/0253554 A1    Oct. 7, 2010

(30) Foreign Application Priority Data

Apr. 3, 2009    (CN) .......................... 2009 1 0133833

(51) Int. Cl.
*H03M 11/00*    (2006.01)
(52) U.S. Cl. .......................................... 341/26; 341/24
(58) Field of Classification Search .................... 341/24, 341/25, 26
See application file for complete search history.

(56) References Cited

U.S. PATENT DOCUMENTS

| | | | | |
|---|---|---|---|---|
| 4,242,674 A * | 12/1980 | Wheeler | ........................ | 340/635 |
| 4,633,228 A * | 12/1986 | Larson | ............................. | 341/26 |
| 7,161,505 B1 * | 1/2007 | Falik et al. | ....................... | 341/26 |
| 2003/0058845 A1* | 3/2003 | Tierling | ........................ | 370/357 |
| 2007/0247339 A1* | 10/2007 | Lu | ................................... | 341/26 |
| 2010/0066572 A1* | 3/2010 | Dietz et al. | ...................... | 341/34 |

* cited by examiner

*Primary Examiner* — Howard Williams
(74) *Attorney, Agent, or Firm* — Li & Cai Intellectual Property (USA) Office

(57) ABSTRACT

A ghost key detecting circuit includes at least first and second scan lines, at least first and second return lines, a plurality of switch elements, and a level detecting circuit. The level detecting circuit is used for performing level detection upon measured voltage values at the first and second return lines. When a measured voltage value at a return line is greater than or equal to a reference voltage value, the level detecting circuit generates a logic signal for indicating that a switch element corresponding to the return line at a current scan line is turned off. When the measured voltage value is smaller than the reference voltage value, the level detecting circuit generates a logic signal for indicating that the switch element is turned on.

11 Claims, 12 Drawing Sheets

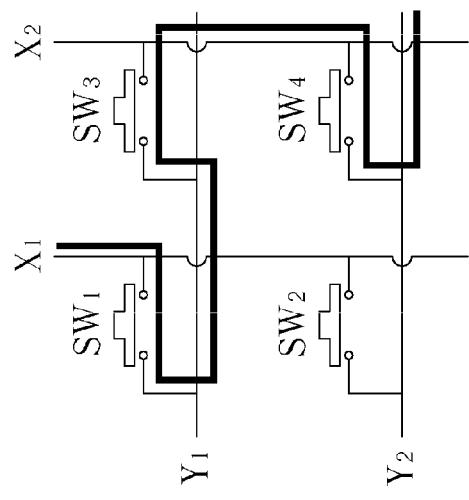
FIG. 2A PRIOR ART
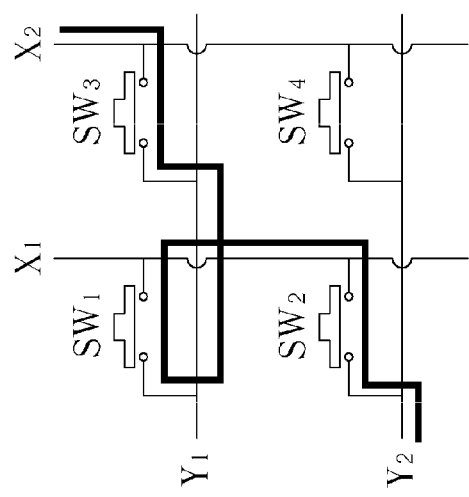
FIG. 2B PRIOR ART
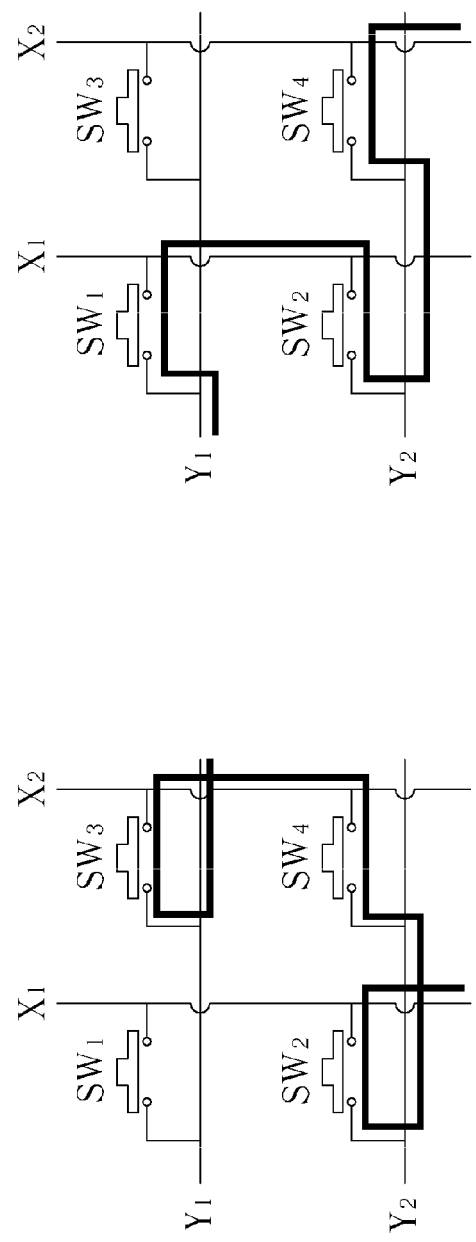
FIG. 2C PRIOR ART
FIG. 2D PRIOR ART

GHOST KEY DETECTING CIRCUIT AND RELATED METHOD

BACKGROUND OF THE INVENTION

1. Field of the Invention

The present invention relates to a ghost key detecting circuit, and more particularly, to a keyboard with a key matrix structure, and a method thereof.

2. Description of the Prior Art

Conventionally, a keyboard is designed by a key matrix structure in order to avoid increased manufacturing costs and the inconvenience of assembly due to the use of too many connection lines. Due to the physical characteristics of the key matrix, however, the ghost key phenomenon cannot be ignored.

Prior art methods increase the size of the key matrix or separate each key by diodes to avoid the ghost key phenomenon. However, both these methods result in the manufacturing costs of the keyboard being increased by a significant degree.

SUMMARY OF THE INVENTION

It is therefore one of the objectives of the present invention to provide a ghost key detecting circuit with an innovative design to solve the above mentioned problems and decrease the manufacturing cost.

According to an embodiment of the present invention, a ghost key detecting circuit is disclosed. The ghost key detecting circuit includes a plurality of switch elements each having a predetermined resistance, at least a set of scan lines, at least a set of return lines, and a level detecting circuit, wherein the set of scan lines and the set of return lines are crossed to each other and coupled to the plurality of switch elements, respectively. The level detecting circuit is coupled to the set of return lines for performing level detection upon measured voltage values at the set of return lines to indicate that at least a switch element corresponding to the set of return lines at the set of scan lines is turned on or turned off.

According to an embodiment of the present invention, a method employed in a ghost key detecting circuit is disclosed. The ghost key detecting circuit includes at least a plurality of switch elements each having a predetermined resistance, at least a set of scan lines and at least a set of return lines, wherein the set of scan lines and the set of return lines are crossed to each other and coupled to the plurality of switch elements, respectively. The method includes the following steps: performing level detection upon at least a measured voltage value at the set of return lines; when a measured voltage value of at least a return line of the set of return lines is greater than or equal to a reference voltage value, generating a logic signal for indicating that a switch element corresponding to the return line at a current scan line is turned off; and when the measured voltage value at the return line is smaller than the reference voltage value, generating the logic signal for indicating that the switch element corresponding to the return line at the current scan line is turned on.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 2A through FIG. 2D are diagrams illustrating the possible cases of the ghost key phenomenon at the key matrix shown in FIG. 1.

DETAILED DESCRIPTION

Figure 1:
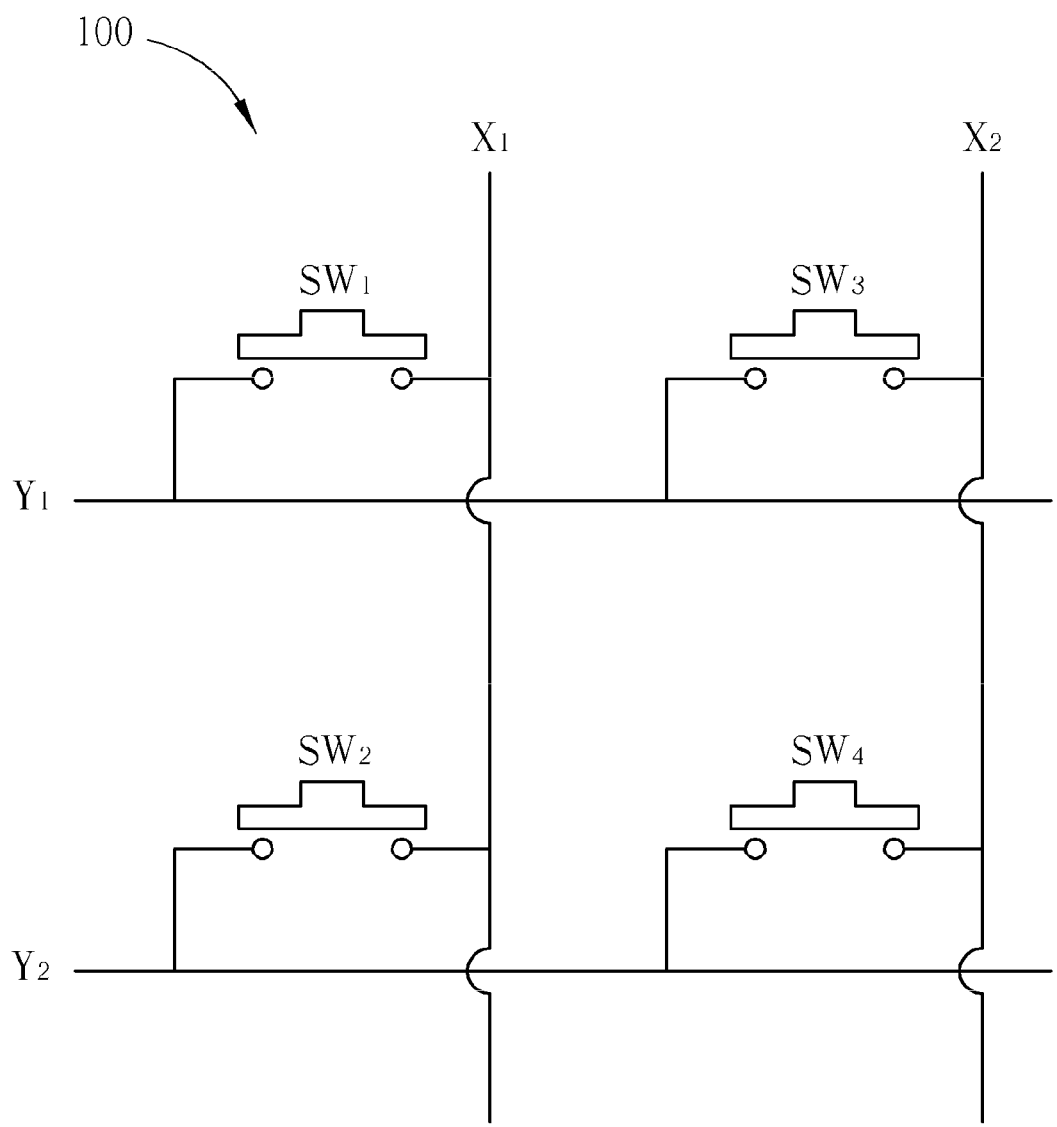
FIG. 1 is a diagram illustrating a general keyboard with a standard 2×2 key matrix.

In order to illustrate the present invention more clearly, the causes of the ghost key are briefly illustrated here. Please refer to FIG. 1. FIG. 1 is a diagram illustrating a general keyboard with a standard 2×2 key matrix 100. The key matrix 100 includes four keys, implemented as a double cross structure and corresponding to the membrane switch elements $SW_1$-$SW_4$, respectively. Each membrane switch element $SW_1$-$SW_4$ has a first node and a second node. When a key corresponding to a membrane switch element (e.g., $SW_1$) is depressed, the first node thereof will contact with the second node thereof, and the membrane switch element will be turned on, thereby making the scan line $X_1$ turned on with the return line $Y_1$. Therefore, it can be known whether the key corresponding to the membrane switch element $SW_1$ is currently depressed according to the signal at the return line $Y_1$. When the key corresponding to the membrane switch element is not depressed, the first node thereof will not contact with the second node thereof, and the membrane switch element is turned off. Therefore, there is no signal transmitted at the return line $Y_1$.

Because of the physical characteristics of the above-mentioned key matrix 100, when any three of the keys corresponding to the switch elements $SW_1$-$SW_4$ are depressed, even if the remaining key is not depressed, the system will make an erroneous judgment that the remaining key has been depressed, where the remaining key is the so-called ghost key. To more specifically describe the ghost key phenomenon, please refer to FIG. 2A through FIG. 2D, which illustrate the possible cases of the ghost key phenomenon at the key matrix 100 shown in FIG. 1. As shown in FIG. 2A, when the switch elements $SW_1$-$SW_3$ are turned on, the scan line $X_2$ and the return line $Y_2$ will be turned on by another transmission path (i.e., the black thick line via the switch elements $SW_1$-$SW_3$), and the switch elements $SW_4$ will also be turned on, leading to an erroneous judgment that the key corresponding to the switch element $SW_4$ is depressed (i.e., the ghost key phenomenon). Furthermore, as shown in FIG. 2B, when the switch elements $SW_2$-$SW_4$ are turned on by depressing the corresponding keys, the scan line $X_1$ and the return line $Y_1$ will be turned on by another transmission path provided by the switch elements $SW_2$-$SW_4$, leading to an erroneous judgment that the key corresponding to the switch element $SW_1$ is depressed. In addition, as shown in FIG. 2C, the scan line $X_1$ and the return line $Y_2$ will be turned on by another transmission path provided by the switch elements $SW_1$, $SW_3$, $SW_4$, leading to an erroneous judgment that the key corresponding to the switch element $SW_2$ is depressed. Moreover, as shown in FIG. 2D, when the scan line $X_2$ and the return line $Y_1$ are turned on, an erroneous judgment indicating that the key corresponding to the switch element $SW_2$ is depressed will be made.

Figure 3:
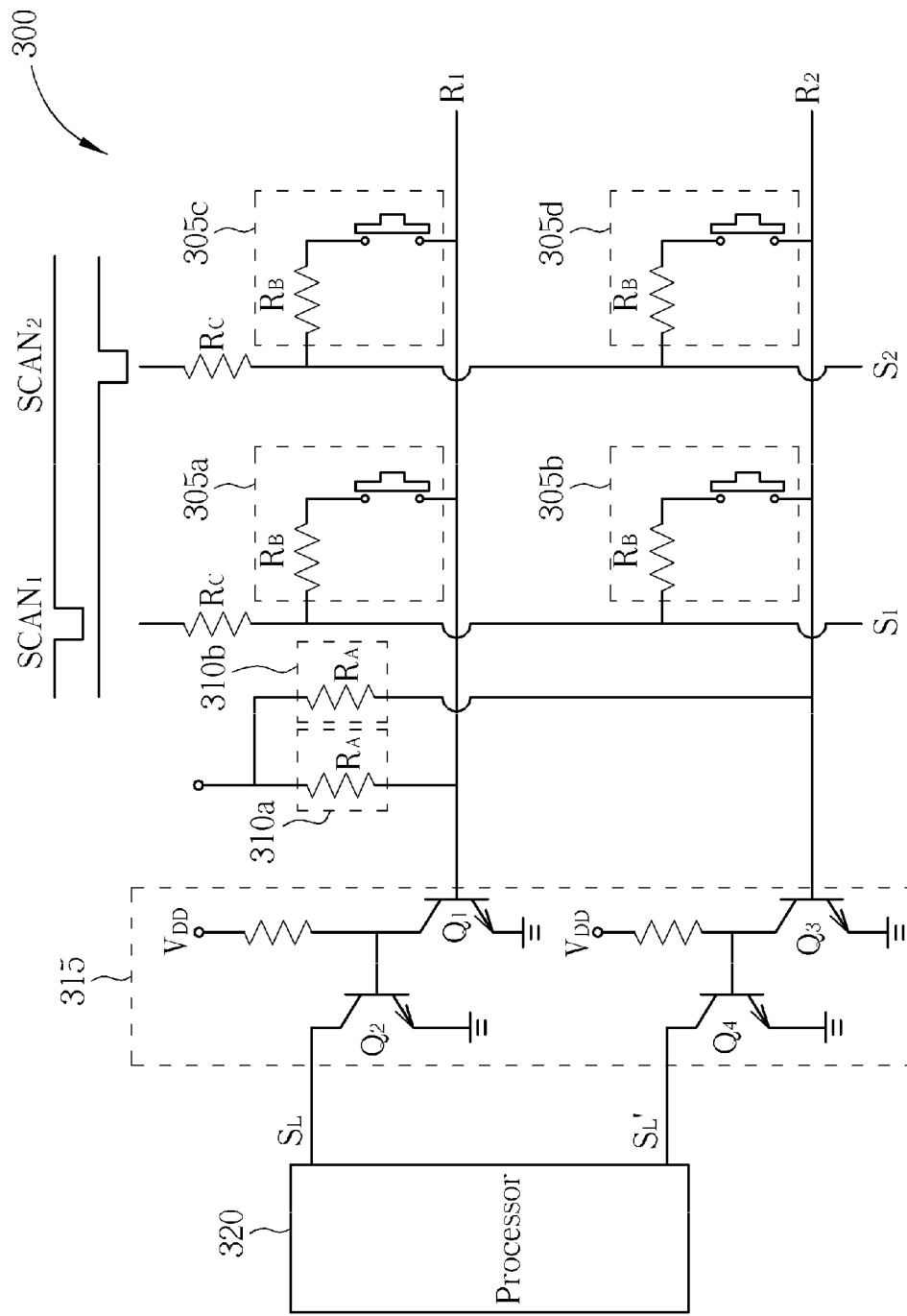
FIG. 3 is a diagram illustrating a ghost key detecting circuit according to an exemplary embodiment of the present invention.

The innovative design of the present invention will prevent the afore-mentioned ghost key phenomenon, by distinguishing if a key is actually depressed. Please refer to FIG. 3. FIG. 3 is a diagram illustrating a ghost key detecting circuit 300 according to an exemplary embodiment of the present invention. The ghost key detecting circuit 300 is a membrane keyboard in this embodiment. The ghost key detecting circuit 300 includes at least a set of scan lines including a first scan line $S_1$ and a second scan line $S_2$ each having a resistance $R_C$, at least a set of return lines including a first return line $R_1$ and a second return line $R_2$, a plurality of switch elements 305a-305d each having a predetermined resistance $R_B$, two resistor devices 310a, 310b each having a resistance $R_A$, a level detecting circuit 315 defined with a reference voltage value $V_{th}$, and a processor 320, wherein the first scan line $S_1$, the second scan line $S_2$, the first return line $R_1$ and the second return line $R_2$ are crossed with each other and coupled to the switch elements 305a-305d, respectively, thereby forming the double cross structure as shown in FIG. 3. Each switch element of the switch elements 305a-305d has a first node and a second node, wherein at least one of the first node and the second node (i.e., the first node) is smeared with a specific conductive material (e.g., an electrically conductive carbon in this embodiment); therefore, each switch element has the predetermined resistance $R_B$. The first nodes of the switch elements 305a, 305b are coupled to the first scan line $S_1$, and the second nodes of which are coupled to the first return line $R_1$ and the second return line $R_2$, respectively; in addition, the first nodes of the switch elements 305c, 305d are coupled to the second scan line $S_2$, the second nodes of which are coupled to the first return line $R_1$ and the second return line $R_2$, respectively. Additionally, the second nodes of switch elements 305a, 305c are coupled to the resistor device 310a via the first return line $R_1$, the second nodes of switch elements 305b, 305d are coupled to the resistor device 310b via the second return line $R_2$, and the remaining nodes of the resistor devices 310a, 310b are coupled to a voltage source. As shown in FIG. 3, the level detecting circuit 315 is coupled to the first return line $R_1$ and the second return line $R_2$, which can detect the measured voltage values at the first return line $R_1$ and the second return line $R_2$ to indicate the state (e.g., a turn-on state or turn-off state) of the switch elements 305a-305d corresponding to the return line $R_1$, $R_2$ at the scan line $S_1$, $S_2$.

Based on the resistances of the resistor devices 310a, 310b, the switch elements 305a-305d, the first scan line $S_1$ and the second scan line $S_2$, when the conductivity of the switch elements 305a-305d (i.e., the depressed state of the corresponding keys) changes, the measured voltage values at the first return line $R_1$ and the second return line $R_2$ will be affected, and the level detecting circuit 315 can detect the depressed state of the keys corresponding to the switch elements 305a-305d according to the comparison between the reference voltage value $V_{th}$ and the measured voltage values. Based on the afore-mentioned double cross structure, when a switch element is turned on without depressing of the corresponding key, the transmission path will pass though another three switch elements, and the corresponding measured voltage value will derive more divided voltages and become greater than or equal to the reference voltage value $V_{th}$. When a switch element is turned on by depressing the corresponded key, due to the different transmission paths, the corresponding measured voltage value will derive fewer divided voltages, and the corresponding measured voltage value will be lower than the reference voltage value $V_{th}$. Therefore, the depressed states of the keys can be determined by comparing the measured voltage values with the reference voltage value $V_{th}$.

In order to determine the depressed state correctly, the level detecting circuit 315 performs a level detection upon measured voltage values at the first and second return lines $R_1$, $R_2$ to determine the actual depressed state corresponding to each switch element. Specifically, when the level detecting circuit 315 determines that the measured voltage value at the first return line $R_1$ is greater than or equal to the reference voltage value $V_{th}$, the level detecting circuit 315 generates a first logic signal $S_L$ for indicating that the switch element 305a corresponding to the first return line $R_1$ at a current scan line (e.g., the scan line $S_1$) is turned off, that is, the key corresponding to the switch element 305a is not depressed. Conversely, when the measured voltage value at the first return line $R_1$ is smaller than the reference voltage value $V_{th}$, the level detecting circuit 315 generates a second logic signal $S_L'$ for indicating that the switch element 305a is turned on, that is, the key corresponding to the switch element 305a is depressed. Therefore, the processor 320 coupled to the level detecting circuit 315 can determine the actual depressed state corresponding to each switch element according to the first logic signal $S_L$ and the second logic signal $S_L'$ generated by the level detecting circuit 315. Thus, no ghost key phenomenon occurs.

In order to let the level detecting circuit 315 detect the corresponding voltage variations at the first and second return lines $R_1$, $R_2$ according to the reference voltage value $V_{th}$, the level detecting circuit 315 utilizes the electrical connection relation of the internal transistors and the external first and second return lines $R_1$, $R_2$ for defining the reference voltage value $V_{th}$. In detail, the level detecting circuit 315 includes the transistors $Q_1$-$Q_4$, wherein the control nodes (bases) of the transistors $Q_1$, $Q_3$ are coupled to the first and second return lines $R_1$, $R_2$, respectively, the emitters of the transistors $Q_1$, $Q_3$ are coupled to a ground level, and the collectors of the transistors $Q_1$, $Q_3$ are coupled to a supply voltage $V_{DD}$ via the resistors. Otherwise, the control nodes (bases) of the transistors $Q_2$, $Q_4$ are coupled to the collectors of the transistors $Q_1$, $Q_3$, the emitters of the transistors $Q_2$, $Q_4$ are coupled to the ground level, and the collectors of the transistors $Q_2$, $Q_4$ coupled to the processor 320 for providing the first and second logic signals $S_L$, $S_L'$ to the processor 320. The reference voltage value $V_{th}$ is designed as the threshold voltage of the transistor $Q_2$ coupled to the first return lines $R_1$ and the transistor $Q_3$ coupled to the transistor $Q_1$. Taking a first detecting block composed of the transistor $Q_1$ and transistor $Q_2$ as an example, when the measured voltage value at the first return lines $R_1$ is greater than or equal to the threshold voltage of the transistor $Q_1$ (i.e., the reference voltage value $V_{th}$), the transistor $Q_1$ will be turned on to pull down its collector voltage, thereby making the transistor $Q_2$ turn off due to the voltage across the base and emitter not exceeding the threshold voltage (i.e., a turn-on voltage). Thus, the first logic signal $S_L$ has a high logic level, meaning that one of the keys corresponding to the switch elements 305a, 305c at the first return lines $R_1$ is not depressed. When the measured voltage value at the first return lines $R_1$ is smaller than the reference voltage value $V_{th}$, the transistor $Q_1$ will not be turned on, but the transistor $Q_2$ will be turned on due to the voltage across the base and emitter exceeding the turn-on voltage. At this time, the first logic signal $S_L$ has a low logic level, meaning that one of the keys corresponding to the switch elements 305a, 305c at the first return lines $R_1$ is depressed. The operations of a second detecting block composed of the transistor $Q_3$ and transistor $Q_4$ are similar to the first detecting block, and therefore further description is omitted here for brevity. In accordance with the conductivity states of the above-mentioned transistors $Q_1$-$Q_4$, signals with different logic levels can be outputted to indicate if the key is depressed. When the level detecting circuit 315 detects the corresponding voltage variations at the first and second return lines $R_1$, $R_2$ according to the reference voltage value $V_{th}$, the level detecting circuit 315 generates the corresponding logic signal to determine the depressed state of the key corresponding to each of the switch elements 305a-305d.

Figure 4:
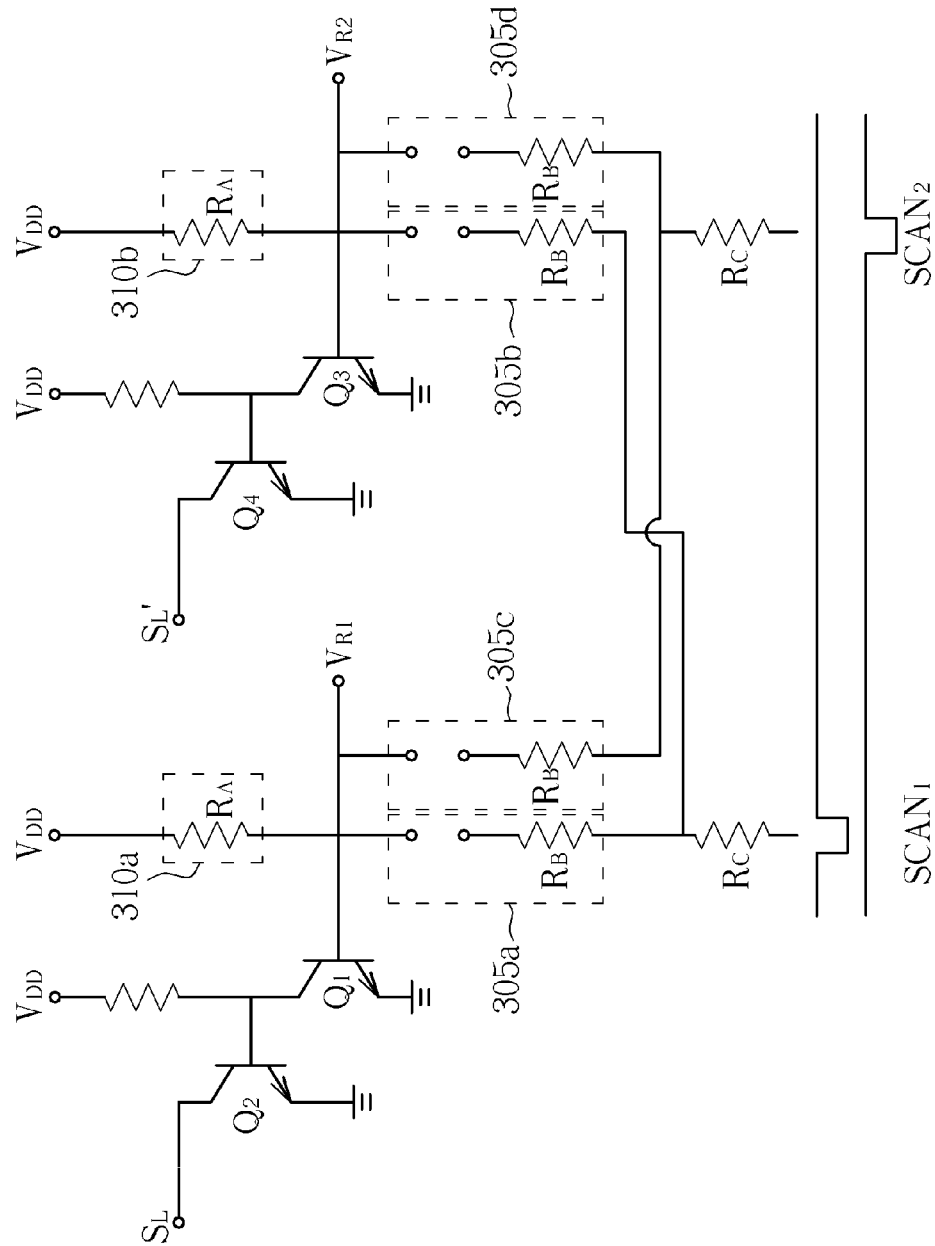
FIG. 4 is a diagram illustrating an equivalent circuit of the ghost key detecting circuit shown in FIG. 3.

Please refer to FIG. 4. FIG. 4 is a diagram illustrating an equivalent circuit of the ghost key detecting circuit 300 shown in FIG. 3. As shown in FIG. 4, when the first scan line $S_1$ is active, the voltage $SCAN_1$ connected to the first scan line $S_1$ is a low voltage, and the voltage $SCAN_1$ can be regarded as coupled to the ground level in this embodiment of the present invention. When the second scan line $S_2$ is active, the voltage $SCAN_2$ connected to the second scan line $S_2$ is a low voltage, and the voltage $SCAN_2$ can also be regarded as coupled to the ground level in this embodiment of the present invention. As shown in FIG. 4, when the switch elements 305a-305d are turned off and the first and second scan lines $S_1$, $S_2$ are active, the supply voltage $V_{DD}$ will respectively turn on the transistors $Q_1$, $Q_3$ via the resistor devices 310a, 310b, thereby making the first and second logic signals $S_L$, $S_L'$ both have high logic levels. Thus, the processor 320 determines the depressed state of the key corresponding to each switch element according to the active states of the first and second scan lines and the logic levels of the signals $S_L$, $S_L'$.

Figure 5:
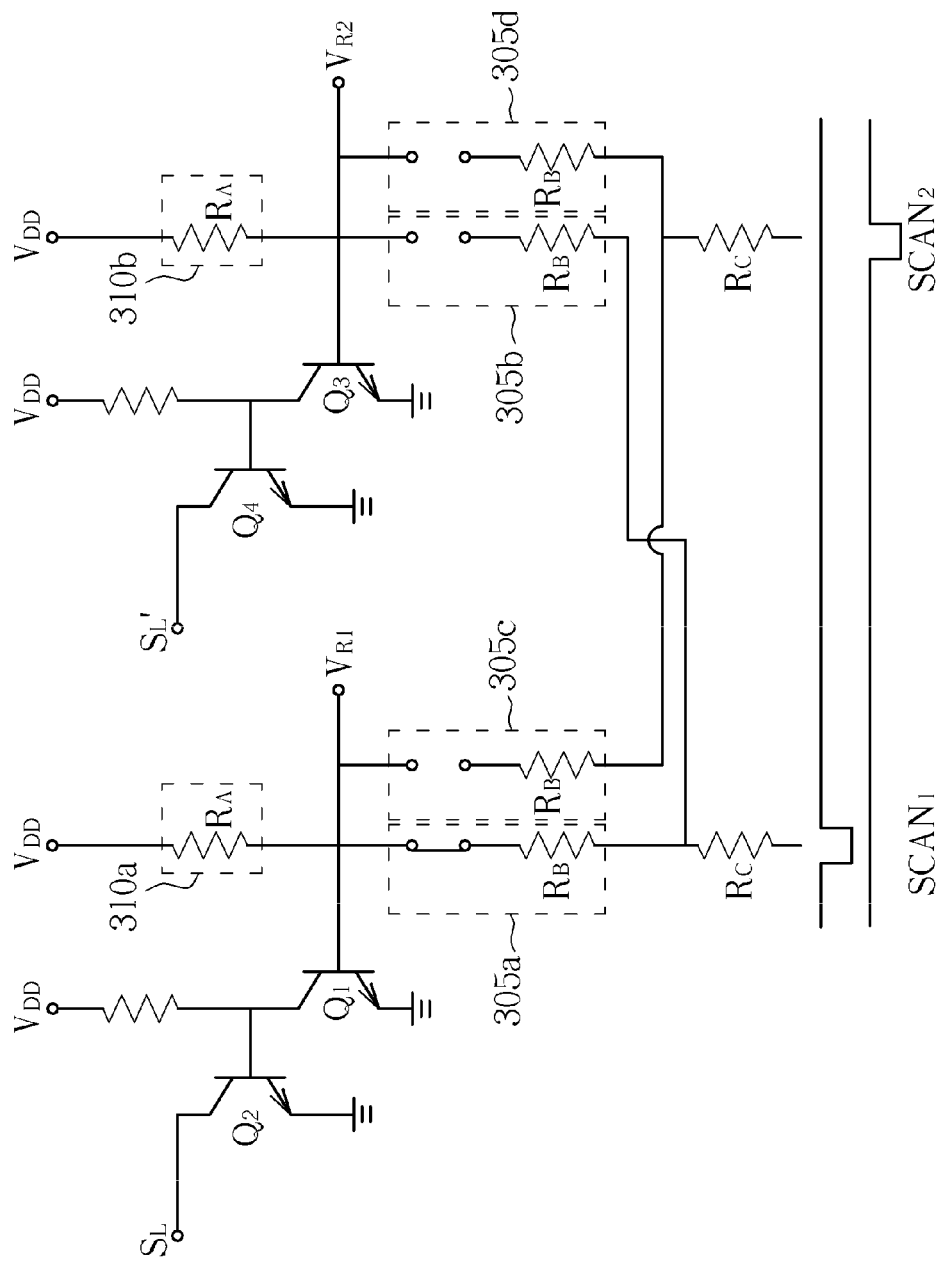
FIG. 5 is a diagram illustrating an equivalent circuit of the ghost key detecting circuit operated in a case where a key corresponding to a first switch element shown in FIG. 3 is depressed.
Figure 6:
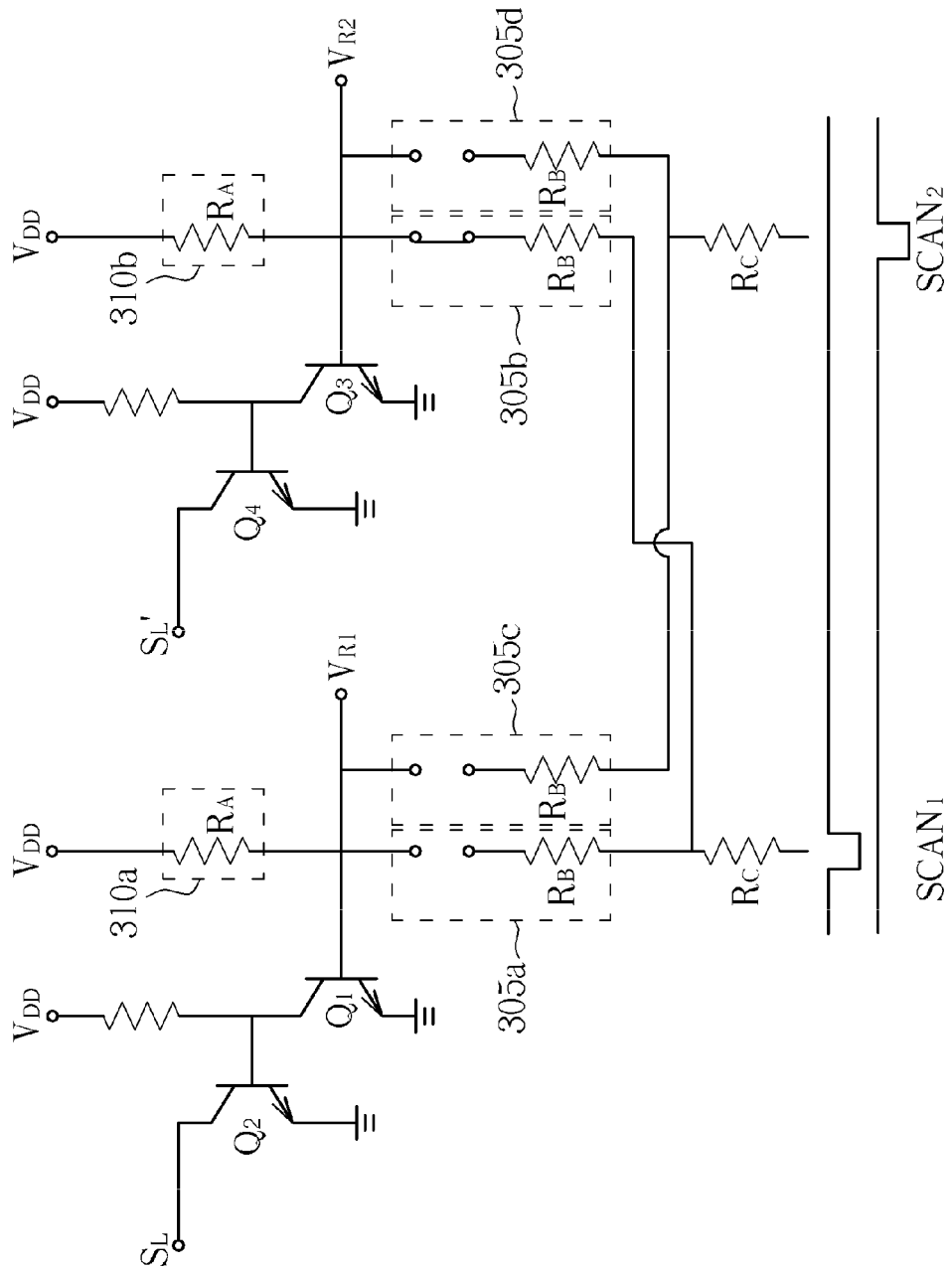
FIG. 6 is a diagram illustrating an equivalent circuit of the ghost key detecting circuit operated in a case where a key corresponding to a second switch element shown in FIG. 3 is depressed.
Figure 7:
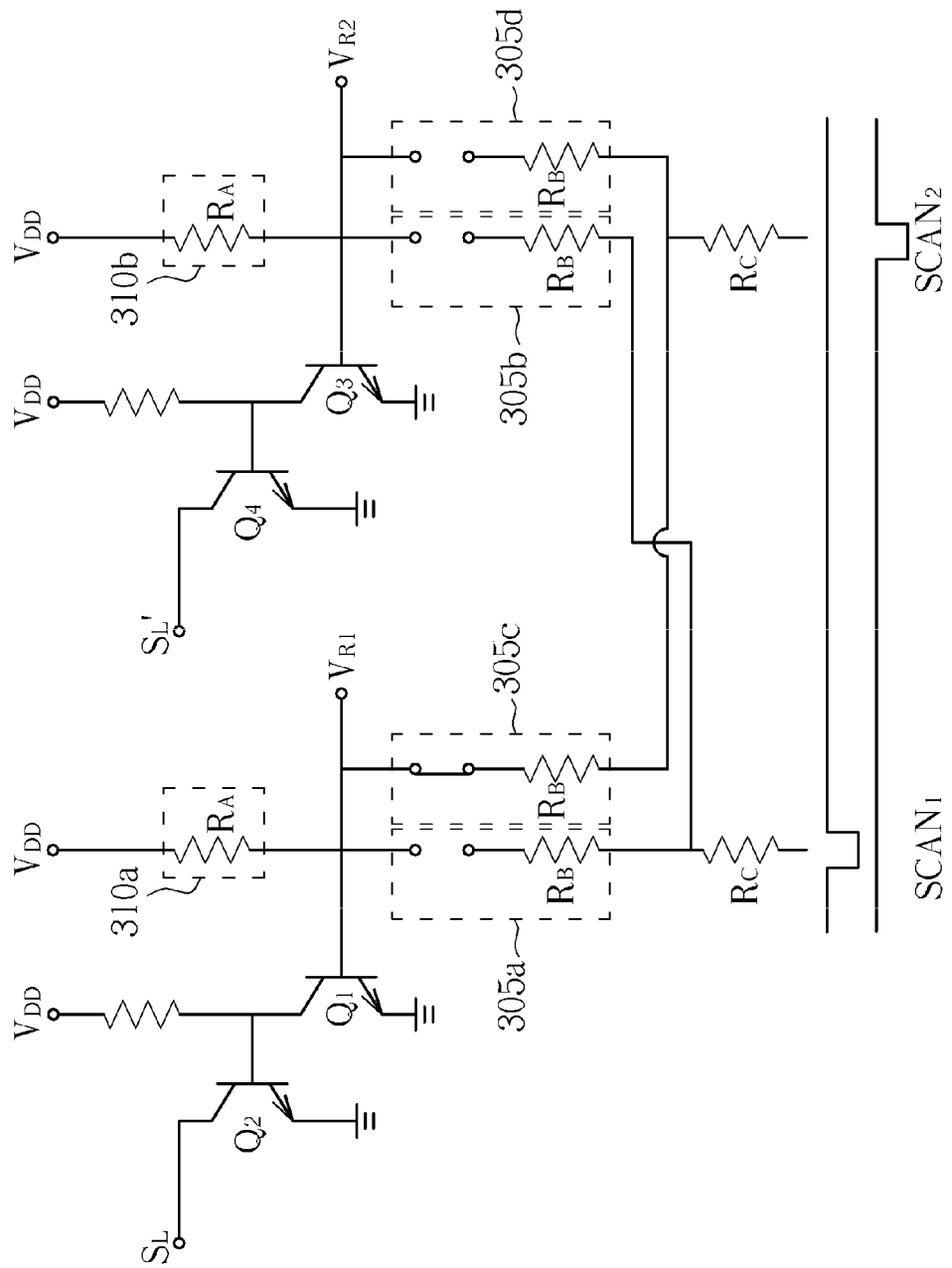
FIG. 7 is a diagram illustrating an equivalent circuit of the ghost key detecting circuit operated in a case where a key corresponding to a third switch element shown in FIG. 3 is depressed.
Figure 8:
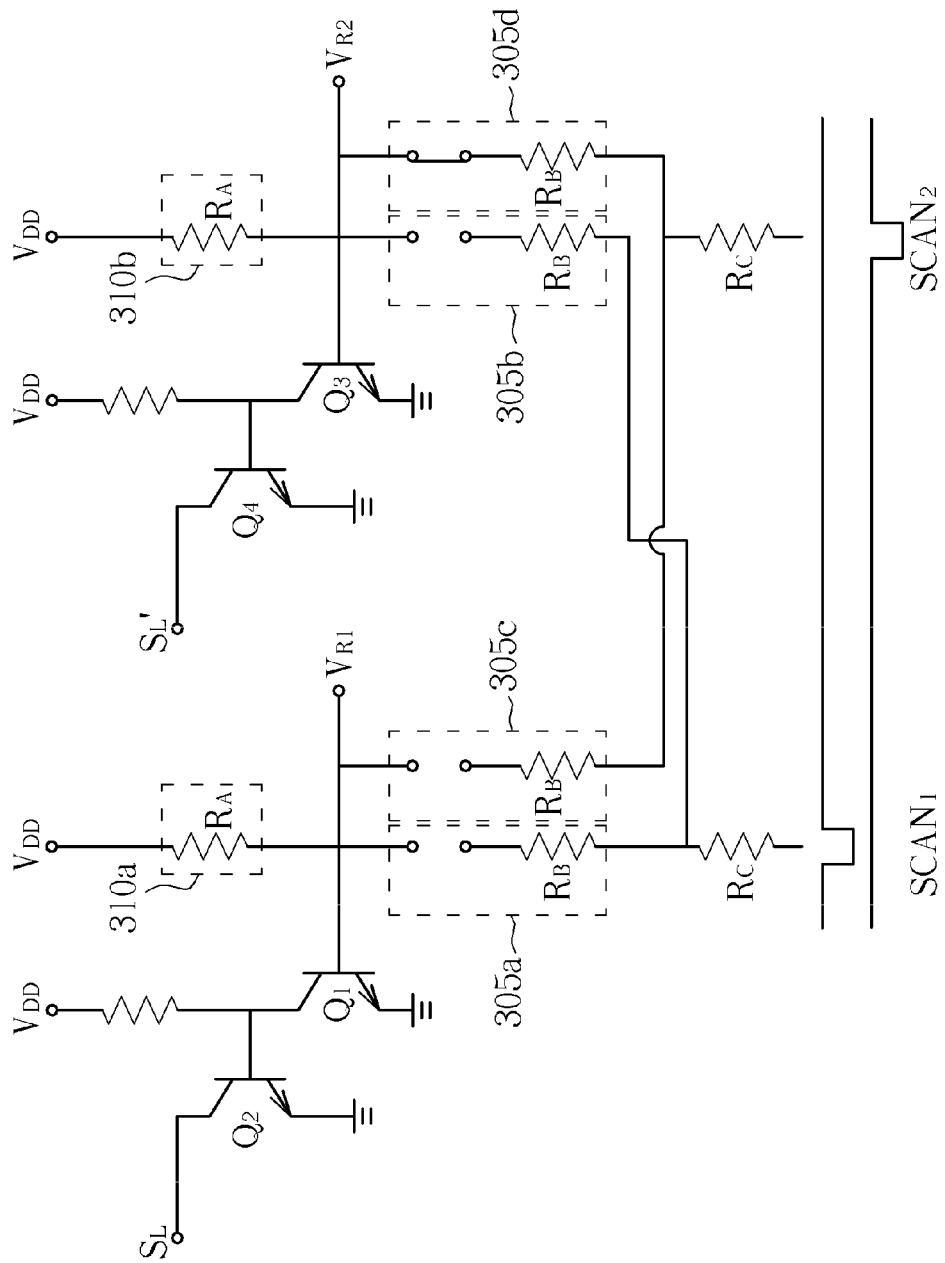
FIG. 8 is a diagram illustrating an equivalent circuit of the ghost key detecting circuit operated in a case where a key corresponding to a fourth switch element shown in FIG. 3 is depressed.

FIG. 5 through FIG. 8 are diagrams illustrating the equivalent circuits representing that the keys corresponding to the switch elements 305a-305d shown in FIG. 3 are depressed, respectively. Because the circuit operations of FIG. 6 through FIG. 8 are similar to the circuit shown in FIG. 5, only the equivalent circuit shown in FIG. 5 is illustrated and depicted for brevity.

As shown in FIG. 5, only the key corresponding to the switch element 305a is depressed and the remaining keys are not. When the second scan line $S_2$ is active, the supply voltage $V_{DD}$ will turn on the transistor $Q_3$ via the resistor device 310b, thereby making the second logic signal $S_L'$ have a high logic level. However, when the first scan line $S_1$ is active, a measured voltage value $V_{R1}$ at the first return line $R_1$ affected by the divided voltage can be expressed as follows:

$$V_{R1}=V_{DD}\times(R_B+R_C)/(R_A+R_B+R_C)$$

As mentioned above, the measured voltage value $V_{R1}$ is determined by the relation of the resistance $R_A$ of the resistor device 310a, the predetermined resistance $R_B$ of the switch element 305a and the resistance $R_C$ of the scan line $S_1$. Based on the above-mentioned relation, when only the switch element 305a is turned on, the measured voltage value $V_{R1}$ at the first return line $R_1$ is smaller than the threshold voltage of the transistor $Q_1$ (i.e., the reference voltage value $V_{th}$). Therefore, the transistor $Q_1$ will not be turned on, and the first logic signal $S_L$ has a low logic level, so the processor 320 can actually detect that only the key corresponding to the switch element 305a is depressed; the relation between the $V_{R1}$ and $V_{th}$ can be expressed as follows:

$$V_{R1}=V_{DD}\times(R_B+R_C)/(R_A+R_B+R_C)<V_{th}$$

It can be designed that the resistance $R_A$ is far greater than the resistance $R_B$ and $R_C$ to make the divided voltage $V_{R1}$ smaller than the threshold voltage $V_{th}$ of the transistor $Q_1$.

Figure 9:
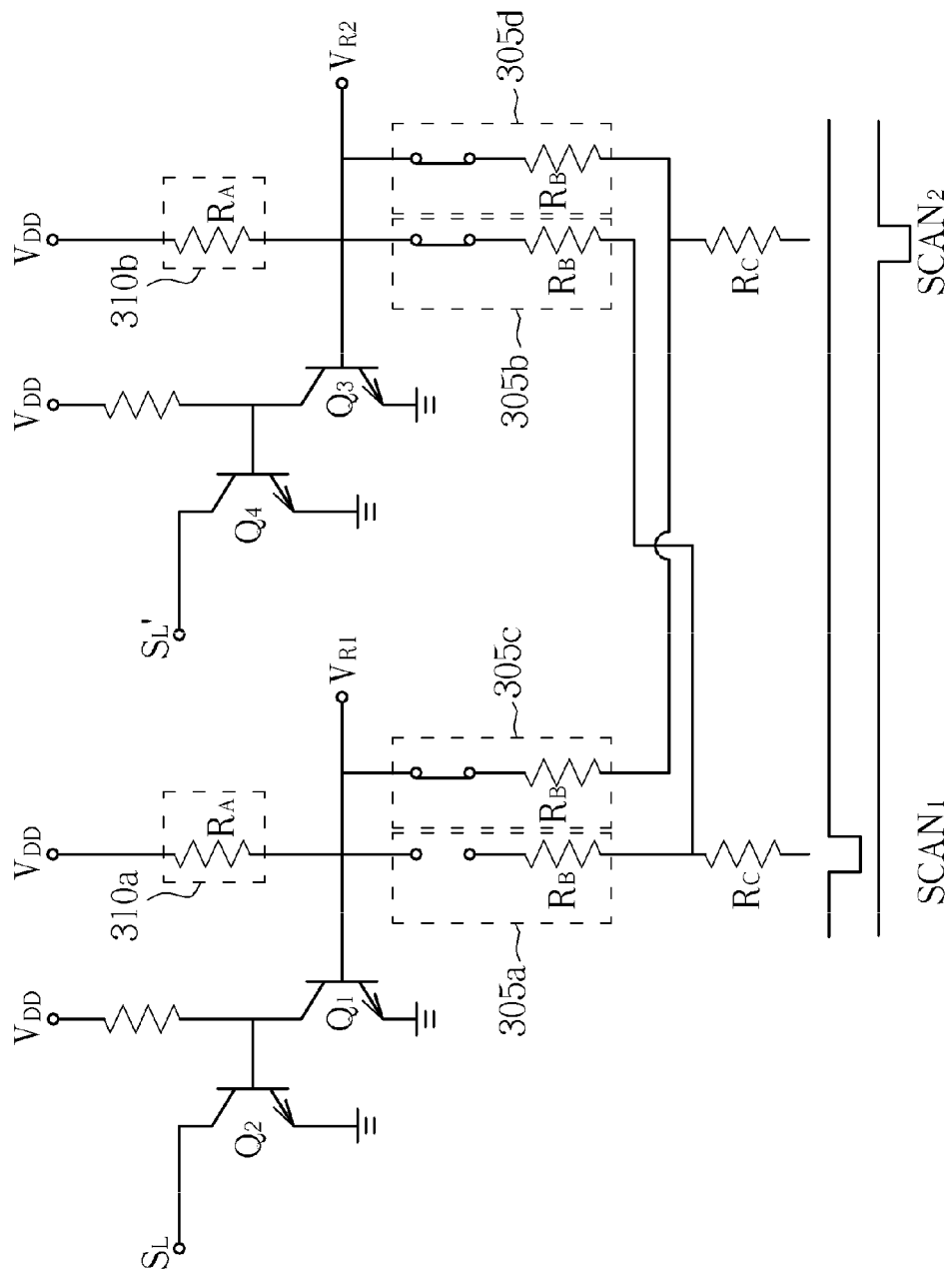
FIG. 9 is a diagram illustrating an equivalent circuit of the ghost key detecting circuit operated in a case where keys corresponding to the second, third and fourth switch elements shown in FIG. 3 are depressed and the key corresponding to the remaining first switch element is not depressed.
Figure 10:
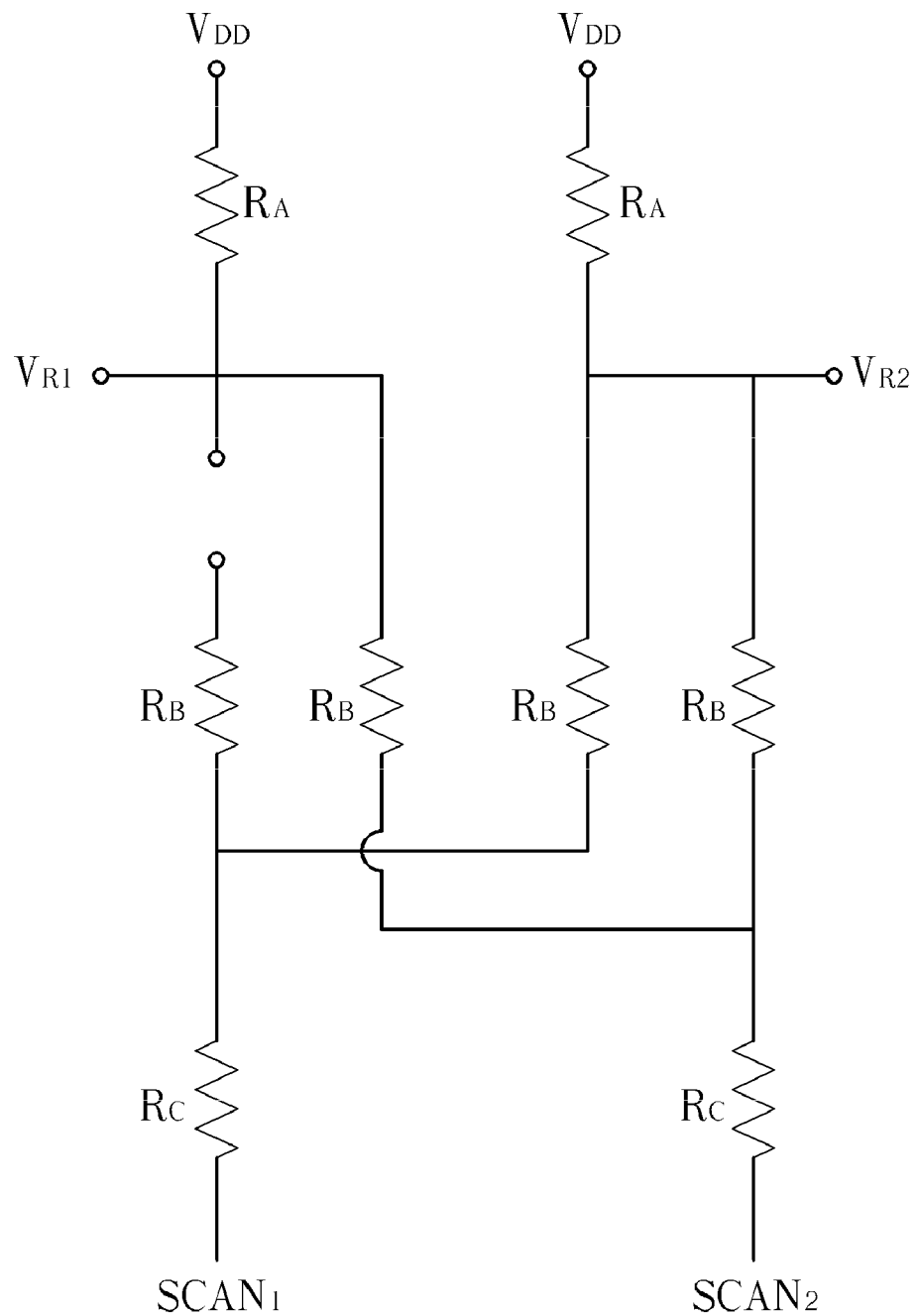
FIG. 10 is a diagram illustrating a simplified circuit of the equivalent circuit shown in FIG. 9.
Figures 11A, 11B:
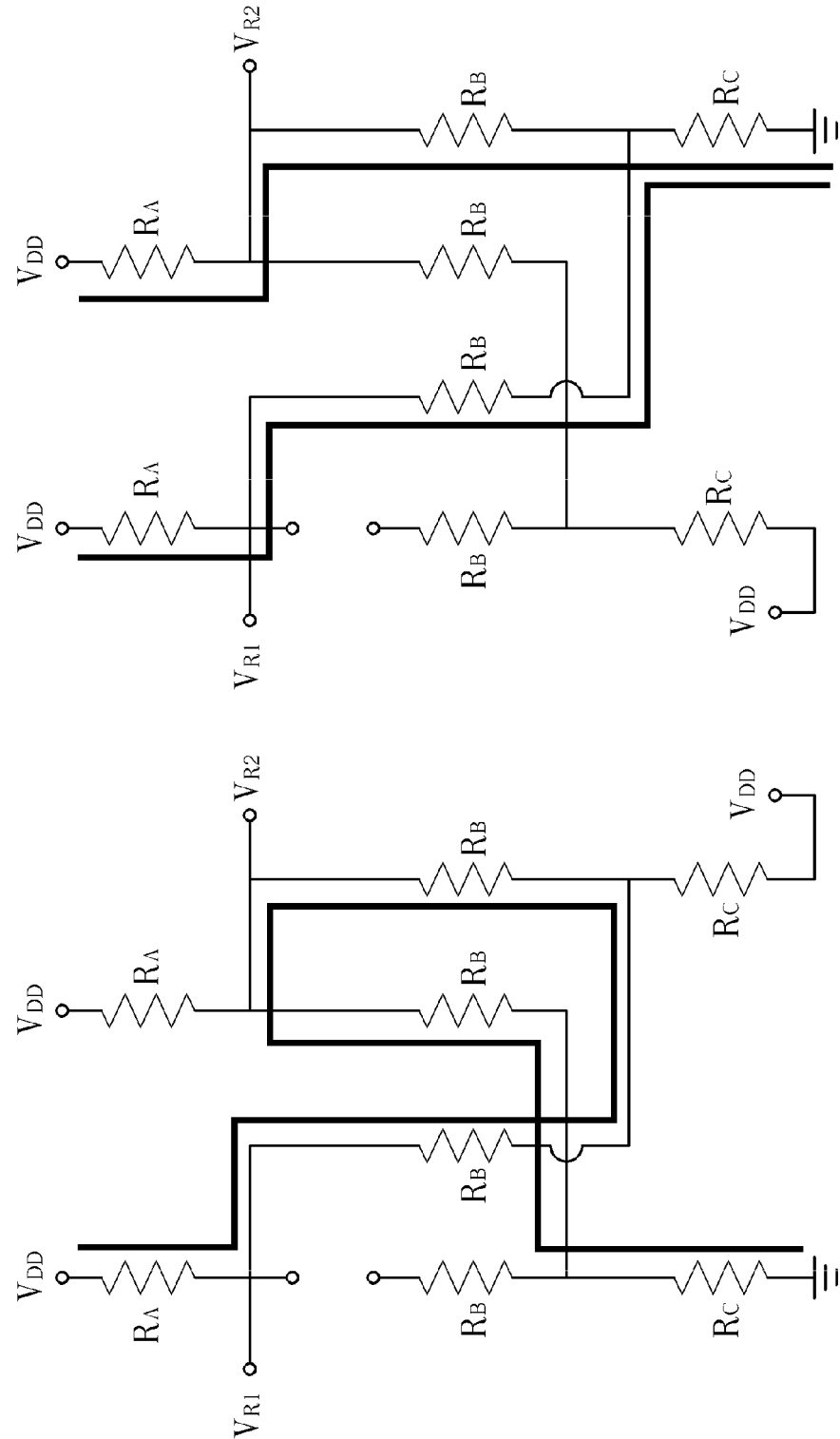
FIG. 11A is a diagram illustrating operation of the simplified circuit shown in FIG. 10 operated in a case where the first scan line is active.
FIG. 11B is a diagram illustrating operations of the simplified circuit shown in FIG. 10 operated in a case where the second scan line is active.

Please refer to FIG. 9. FIG. 9 is a diagram illustrating an equivalent circuit which represents that the keys corresponding to the switch elements 305b-305d shown in FIG. 3 are depressed and the remaining key corresponding to the switch element 305a is not depressed. FIG. 10 is a diagram of a simplified circuit of the equivalent circuit related to the resistance $R_A$, $R_B$ and $R_C$ shown in FIG. 9. FIG. 11A and FIG. 11B are diagrams illustrating the equivalent circuits of the circuit shown in FIG. 10 operated in a case where the first scan line $S_1$ is active and in another case where the second scan line $S_2$ is active, respectively. As shown in FIG. 11B, when the second scan line $S_2$ is active, the voltage $SCAN_2$ is similar to a ground level and the voltage $SCAN_1$ is similar to a supply voltage (e.g., $V_{DD}$), the voltage values of the $V_{R1}$ and $V_{R2}$ are equal to $V_{DD}*(R_B+R_C)/(R_A+R_B+R_C)$ at this time. As mentioned above, $V_{DD}*(R_B+R_C)/(R_A+R_B+R_C)$ will be lower than the predetermined threshold voltage $V_{th}$, and the processor 320 can determine that the keys corresponding to the switch elements 305b-305d are depressed correctly by the aforementioned operations of the level detecting circuit 315. As shown in FIG. 11A, when the first scan line $S_1$ is active, the voltage $SCAN_1$ is similar to a ground level and the voltage $SCAN_2$ is similar to a supply voltage (e.g., $V_{DD}$). The voltage values of the $V_{R1}$ and $V_{R2}$ are different, where the voltage value of the $V_{R2}$ is equal to $V_{DD}*(R_B+R_C)/(R_A+R_B+R_C)$, and the voltage value of the $V_{R1}$ affected by the divided voltage can be expressed as follows:

$$V_{R1}=V_{DD}\times(3\times R_B+R_C)/(R_A+3\times R_B+R_C)$$

Therefore, the measured voltage value $V_{R1}$ is determined by the relation of the resistance $R_A$, the predetermined resistance $R_B$ of the switch elements 305b-305d and the resistance $R_C$ of the scan line $S_2$. When any three keys of the key matrix are depressed and the remaining one is not, although a switch element corresponding to the remaining key will be determined as turned on via another transmission path, the measured voltage value at the return line generated by this transmission path will be different from the measured voltage value at the return line generated by a transmission path in which the remaining key is actually depressed. Therefore, this exemplary embodiment can properly design the resistance $R_A$, $R_B$ and $R_C$ to make the measured voltage value $V_{R1}$ greater than or equal to the threshold voltage of the transistor $Q_1$ (i.e., the reference voltage value $V_{th}$). Therefore, the transistor $Q_1$ will be turned on, and the first logic signal $S_L$ has a high logic level, so the processor 320 can actually detect that only the key corresponding to the switch element 305a is not depressed. The relation between the $V_{R1}$ and $V_{th}$ can be expressed as follows:

$$V_{R1}=V_{DD}\times(3\times R_B+R_C)/(R_A+3\times R_B+R_C)\geq V_{th} \qquad 5$$

Therefore, the ghost key detecting circuit 300 of this exemplary embodiment can achieve the following function by designing the $R_A$, $R_B$ and $R_C$ properly and operating the transistors of the level detecting circuit 315 stably: when any three keys of the double cross structure are depressed and a remaining one is not, the ghost key detecting circuit 300 can determine that the remaining key is not actually depressed; that is, the ghost key detecting circuit 300 will not make an erroneous judgment due to the physical characteristics of the double cross structure, so the ghost key phenomenon can be prevented.

Figure 12:
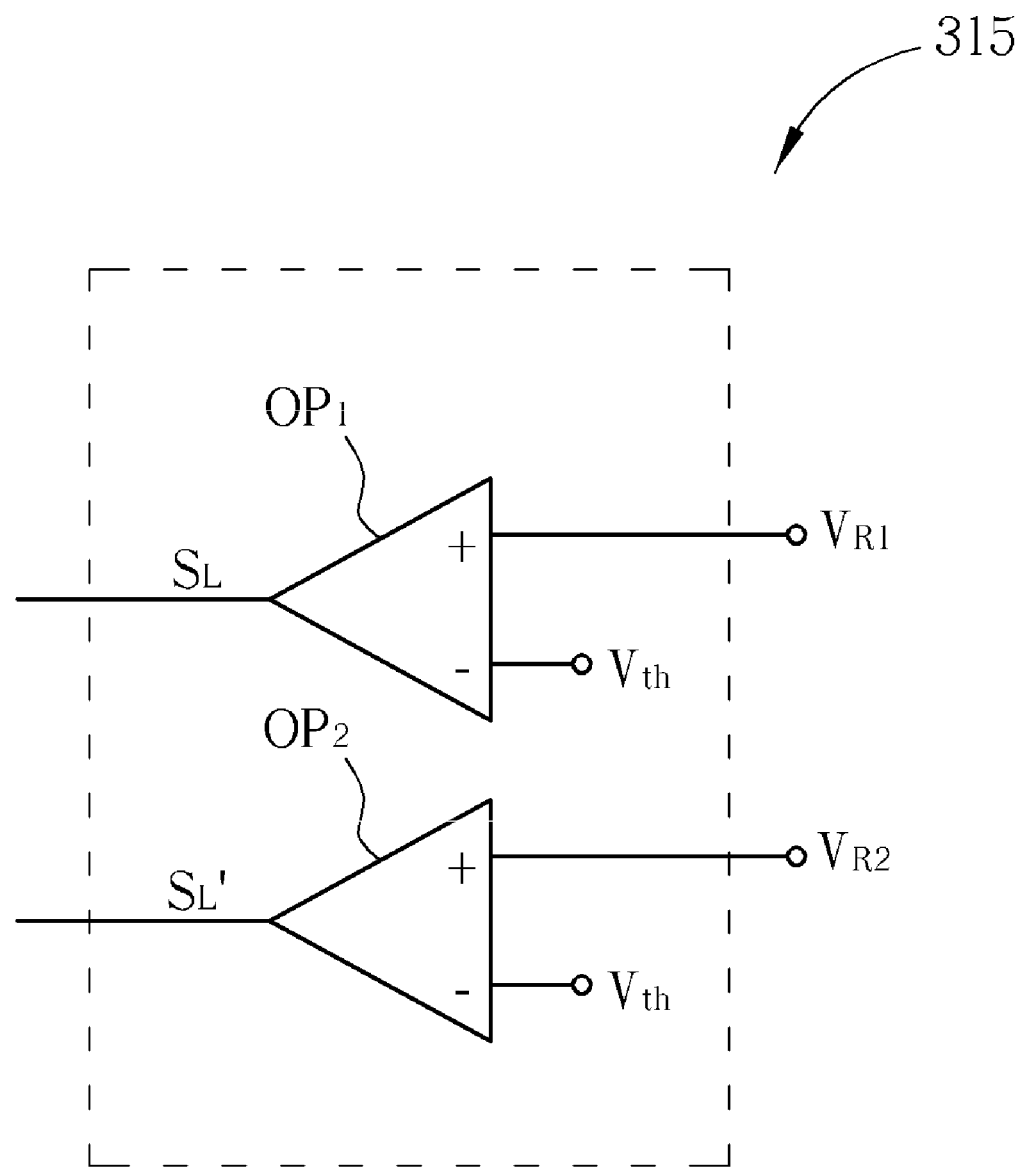
FIG. 12 is a diagram illustrating an alternative design of the level detecting circuit shown in FIG. 3 according to another embodiment of the present invention.

In another embodiment, the transistors $Q_1$-$Q_4$ of the level detecting circuit 315 can be implemented by field effect transistors (FET). Moreover, in other embodiments, the partial operation of the first and second detecting blocks can be implemented by operational amplifiers. Please refer to FIG. 12. FIG. 12 is a diagram illustrating an alternative design of the level detecting circuit 315 shown in FIG. 3 according to another embodiment of the present invention. As shown in FIG. 12, the afore-mentioned first and second detecting blocks are implemented by the operational amplifiers $OP_1$, $OP_2$, wherein the operational amplifiers $OP_1$, $OP_2$ serve as comparators. Taking the comparator $OP_1$ as an example, the comparator $OP_1$ has an inverting input node coupled to the reference voltage value $V_{th}$, a non-inverting input node for receiving the measured voltage value $V_{R1}$ at the first return line $R_1$ and an output node for generating the first logic signal $S_L$; when the measured voltage value $V_{R1}$ at the first return line $R_1$ is greater than the reference voltage value $V_{th}$, the comparator $OP_1$ outputs the first logic signal $S_L$ with a high logic level, and when the measured voltage value $V_{R1}$ at the first return line $R_1$ is smaller than the reference voltage value $V_{th}$, the comparator $OP_1$ outputs the first logic signal $S_L$ with a low logic level. The operations of the comparator $OP_2$ are similar to that of the comparator $OP_1$. Therefore, as mentioned above, implementing the level detecting circuit 315 with operational amplifiers can also make the processor 320 determine if a key corresponding to the double cross structure is actually depressed, which also falls within the scope of the present invention. In another embodiment, one of the first and second detecting blocks can be implemented by transistors shown in FIG. 3, and the other block can be implemented by an operational amplifier. In other words, in the embodiments of the present invention, at least one of the first and second detecting blocks will be implemented by transistors and related resistors, and at least one of the first and second detecting blocks will be implemented by an operational amplifier. It should be noted that the afore-mentioned variations all obey the spirit of the present invention.

Those skilled in the art will readily observe that numerous modifications and alterations of the device and method may be made while retaining the teachings of the invention.

What is claimed is:

1. A ghost key detecting circuit, comprising:
   a plurality of switch elements each having a predetermined resistance;
   at least a set of scan lines;
   at least a set of return lines, wherein the set of scan lines and the set of return lines are crossed to each other and coupled to the plurality of switch elements, respectively; and
   a level detecting circuit, coupled to the set of return lines, for performing level detection upon measured voltage values at the set of return lines by comparing the measured voltage values with a reference voltage value to indicate that at least one switch element corresponding to the set of return lines at the set of scan lines is turned on or turned off;
   wherein, the level detecting circuit further comprises:
   a first transistor, having a first node coupled to a supply voltage, a second node coupled to a ground level and a control node coupled to a return line for receiving a measured voltage value at the return line, wherein the reference voltage value is a threshold voltage of the first transistor and the first transistor is turned on or turned off based on the measured voltage value; and
   a second transistor, having a first node for generating a logic signal, a second node coupled to the ground level and a control node coupled to the first node of the first transistor.

2. The ghost key detecting circuit of claim 1, wherein when at least a voltage value at the set of return lines is greater than or equal to the reference voltage value, at least a switch element corresponding to the set of return lines at a current scan line is turned off.

3. The ghost key detecting circuit of claim 1, wherein when at least a voltage value at the set of return lines is smaller than the reference voltage value, at least a switch element corresponding to the set of return lines at a current scan line is turned on.

4. The ghost key detecting circuit of claim 1, further comprising:
   a processor, coupled to the level detecting circuit, for determining a state of a key corresponding to each switch element according to the logic signal generated by the level detecting circuit.

5. The ghost key detecting circuit of claim 1, further comprising:
   a plurality of resistor devices, having a first resistance and coupled to the set of return lines, respectively;
   wherein at least one of a first node and a second node of each switch element is coated with a conductive material to make each switch element have its own predetermined resistance, and scan lines included in the set of scan lines have a third resistance, respectively; and when three switch elements of the plurality of switch elements are turned on and a remaining switch element is turned off, a measured voltage value at a return line corresponding to the remaining switch element is greater than or equal to the reference voltage value based on a relation of the first resistance of a resistor device, the predetermined resistance of the three switch elements and the third resistance of the set of scan lines.

6. The ghost key detecting circuit of claim 1, further comprising:
   a plurality of resistor devices, having a first resistance and coupled to the set of return lines, respectively;
   wherein at least one of a first node and a second node of each switch element is coated with a conductive material to make each switch element have its own predetermined resistance, and scan lines included in the set of scan lines have a third resistance, respectively; and when the at least one switch element corresponding to the set of return lines is turned on, a measured voltage value at a return line corresponding to the switch element is smaller than the reference voltage value based on a relation of the first resistance, the predetermined resistance of the switch element and the third resistance of the set of scan lines.

7. The ghost key detecting circuit of claim 1, wherein the level detecting circuit comprises:
a first detecting block, coupled to a first return line of the set of return lines, for receiving a measured voltage value at the first return line to generate a first logic signal; and
a second detecting block, coupled to a second return line of the set of return lines, for receiving a measured voltage value at the second return line to generate a second logic signal;
wherein, the first transistor and the second transistor are disposed in at least one of the first detecting block and the second detecting block.

8. A method employed in a ghost key detecting circuit, the ghost key detecting circuit comprising at least a plurality of switch elements each having a predetermined resistance, at least a set of scan lines and at least a set of return lines, the set of scan lines and the set of return lines being crossed to each other and coupled to the plurality of switch elements, respectively, the method comprising:
performing level detection upon at least a measured voltage value at the set of return lines according to a reference voltage value by a level detecting circuit having a first transistor and a second transistor, wherein the reference voltage value is a threshold voltage of the first transistor and the first transistor is turned on or turned off based on the measured voltage value;
when a measured voltage value at least a return line of the set of return lines is greater than or equal to the reference voltage value, generating a logic signal for indicating that a switch element corresponding to the return line at a current scan line is turned off; and
when the measured voltage value at the return line is smaller than the reference voltage value, generating the logic signal for indicating that the switch element corresponding to the return line at the current scan line is turned on;
wherein, the first transistor has a first node coupled to a supply voltage, a second node coupled to a ground level and a control node coupled to the return line for receiving the measured voltage value at the return line, and a second transistor has a first node for generating the logic signal, a second node coupled to the ground level and a control node coupled to the first node of the first transistor.

9. The method of claim 8, further comprising:
determining a state of a key corresponding to the switch element according to the logic signal.

10. The method of claim 8, wherein the ghost key detecting circuit further comprises a plurality of resistor devices, having a first resistance and coupled to the set of return lines, respectively; and when three switch elements of the plurality of the switch elements are turned on and a remaining switch element is turned off, a measured voltage value at a return line corresponding to the remaining switch element is greater than or equal to the reference voltage value based on a relation of the first resistance of a resistor device, the predetermined resistance of the three switch elements and a third resistance of the set of scan lines.

11. The method of claim 8, wherein the ghost key detecting circuit further comprises a plurality of resistor devices, having a first resistance and coupled to the set of return lines, respectively; and when the switch element corresponding to the return line is turned on, the measured voltage value at the return line corresponding to the switch element is smaller than the reference voltage value based on a relation of the first resistance of a resistor device, the predetermined resistance of the switch element and a third resistance of the set of scan lines.

* * * * *